(12) United States Patent
Wimpenny

(10) Patent No.: US 9,385,663 B2
(45) Date of Patent: Jul. 5, 2016

(54) ENVELOPE TRACKING PUSH-PULL OR DIFFERENTIAL POWER AMPLIFIER

(71) Applicant: SNAPTRACK, INC., San Diego, CA (US)

(72) Inventor: Gerard Wimpenny, Cambridgeshire (GB)

(73) Assignee: SNAPTRACK, INC., San Diego, CA (US)

( * ) Notice: Subject to any disclaimer, the term of this patent is extended or adjusted under 35 U.S.C. 154(b) by 134 days.

(21) Appl. No.: 14/350,218

(22) PCT Filed: Oct. 4, 2012

(86) PCT No.: PCT/EP2012/069652
§ 371 (c)(1),
(2) Date: Dec. 11, 2014

(87) PCT Pub. No.: WO2013/050493
PCT Pub. Date: Apr. 11, 2013

(65) Prior Publication Data
US 2015/0280653 A1    Oct. 1, 2015

(30) Foreign Application Priority Data
Oct. 5, 2011    (GB) .................................. 1117145.1

(51) Int. Cl.
*H04M 1/02* (2006.01)
*H03F 1/02* (2006.01)
(Continued)

(52) U.S. Cl.
CPC ............ *H03F 1/0233* (2013.01); *H03F 1/0222* (2013.01); *H03F 3/19* (2013.01); *H03F 3/21* (2013.01); *H03F 3/26* (2013.01); *H03F 3/45076* (2013.01); *H04M 1/0202* (2013.01); *H03F 2200/09* (2013.01); *H03F 2200/102* (2013.01); *H03F 2200/504* (2013.01); *H03F 2203/45172* (2013.01)

(58) Field of Classification Search
CPC ............................... H03F 1/02; H04M 1/0202
USPC ................... 455/127.3, 127.2, 144, 194.2
See application file for complete search history.

(56) References Cited

U.S. PATENT DOCUMENTS

| 5,274,341 A | 12/1993 | Sekine et al. |
| 5,537,080 A | 7/1996 | Chawla et al. |

(Continued)

FOREIGN PATENT DOCUMENTS

| CN | 1234922 A | 11/1999 |
| EP | 1202446 A2 | 5/2002 |
| GB | 2471308 A | 12/2010 |

OTHER PUBLICATIONS

Parent GB Application No. GV 1117145.1, Examination Report, Dec. 1, 2014, Publisher: UK IPO, Published in: GB.

(Continued)

*Primary Examiner* — John J Lee

(57) ABSTRACT

There is disclosed a power amplifier arrangement comprising: first and second active devices for amplifying in-phase and anti-phase parts of an input signal; a first DC supply network connected between the output of the first active device and a modulated supply voltage; a second DC supply network connected between the output of the second active device and the same modulated supply voltage and an output combiner for combining the amplified in-phase and anti-phase parts of the input signal.

18 Claims, 7 Drawing Sheets

(51) Int. Cl.
*H03F 3/26* (2006.01)
*H03F 3/19* (2006.01)
*H03F 3/21* (2006.01)
*H03F 3/45* (2006.01)

(56) References Cited

U.S. PATENT DOCUMENTS

| | | | |
|---|---|---|---|
| 6,323,733 B1 | 11/2001 | Gorcea et al. | |
| 6,545,542 B2 * | 4/2003 | Matsuyoshi | H03F 1/3205 330/124 R |
| 6,586,999 B2 * | 7/2003 | Richley | H03F 3/211 330/124 R |
| 2003/0011433 A1 | 1/2003 | Richley | |
| 2008/0204147 A1 | 8/2008 | Rofougaran | |
| 2010/0069025 A1 * | 3/2010 | Takinami | H03F 1/0222 455/127.3 |
| 2010/0171552 A1 | 7/2010 | French et al. | |
| 2011/0284753 A1 * | 11/2011 | Carroll | G01T 1/17 250/369 |

OTHER PUBLICATIONS

Related International Application No. PCT/EP2012/069652, International Preliminary Report on Patentability, Apr. 17, 2014, Publisher: PCT, Published in: CH.

International Patent Application No. PCT/EP2012/069652 International Search Report & Written Opinion, Jun. 21, 2013, Publisher: PCT, Published in: EP.

Parent Patent Application: GB 1117145.1 Search Report, Jan. 25, 2012, Publisher: UK IPO, Published in: GB.

* cited by examiner a)

b)

ENVELOPE TRACKING PUSH-PULL OR DIFFERENTIAL POWER AMPLIFIER

BACKGROUND TO THE INVENTION

1. Field of the Invention

The invention relates to envelope tracking (ET) radio frequency (RF) power amplifiers.

2. Description of the Related Art

Power amplifier systems incorporating envelope tracking power supplies are known in the art. Envelope tracking may be applied to Radio frequency (RF) transmitters operating across a wide range of RF frequencies, from HF (high frequency) to microwave.

In an envelope tracking RF power amplifier system, the supply voltage fed to the power amplifier is adjusted dynamically to track the envelope of the RF input signal being amplified at high instantaneous RF powers. Generating the supply voltage by tracking the signal being amplified improves efficiency of operation by providing only the necessary supply voltage to amplify the instantaneous input signal. An 'ideal' supply voltage instantaneously tracks the instantaneous RF input power signal such that at any instant a sufficient and only a sufficient level of voltage supply is provided.

At high instantaneous RF input powers the power amplifier operates in compression and the RF output power is primarily determined by the supply voltage rather the RF input power. This may be termed a compressed mode of operation. At low instantaneous RF input powers the supply voltage is held substantially constant at some minimum value appropriate for the power amplifier device technology. This may be termed a linear mode of operation. In the linear mode of operation the RF output power is predominantly determined by the RF input power. At medium instantaneous RF power there is a gradual transition between the compressed and linear modes of operation.

The modes of operation of the power amplifier are illustrated in FIG. 1. FIG. 1 illustrates a plot 8 of instantaneous supply voltage for the power amplifier against instantaneous RF input power to the power amplifier. The linear mode of operation takes place in a linear region denoted by reference numeral 2. The compressed mode of operation takes place in a compressed region denoted by reference numeral 6. The transition between these two modes of operation takes place in a transition region 4.

From the above it is apparent that when the power amplifier is operating in the compressed or transition regions of operation any error between the applied supply voltage and the 'ideal' desired supply voltage will result in an error in the instantaneous RF output power of the signal at the output of the power amplifier. The error in the output power, in turn, degrades the linearity of the transmitted RF signal resulting in increased error vector magnitude (EVM) (a measure of in-band distortion), adjacent channel leakage ratio (ACLR) distortion (close to carrier distortion) and for frequency division duplex (FDD) systems, receive band noise (far from carrier distortion).

An 'ideal' envelope tracking power supply (also known as an envelope amplifier or an envelope modulator) may be modelled as a modulated voltage source which is connected to the drain or collector of a power amplifier transistor via a feed network. In a typical RF power amplifier arrangement the feed network has two main functions: (i) to provide a low impedance path for DC to video frequency currents flowing between the envelope tracking power supply and the power amplifier device intrinsic collector or drain; and (ii) to provide relatively high impedance at the RF carrier frequency across which the RF carrier voltage can be developed. It can be noted that in the examples set out in this description the signals in the supply path to the power amplifier are referred to as video frequency (or high frequency) signals, and signals in the input path (i.e. the signals to be amplified) are referred to as RF signals. These two objectives for the supply feed may be opposing, particularly when the frequency separation of the highest video frequency supply currents and the power amplifier RF carrier frequency is small or non existent.

If the supply impedance—seen from the intrinsic drain or collector of the power amplifier device—at the highest frequencies at which significant video currents are present is too high, the error in the supply voltage applied to the drain/collector will result in degradation of the transmit spectrum.

It is an aim of the invention to provide an improved arrangement which addresses one or more of the above-stated problems.

SUMMARY OF THE INVENTION

The invention provides a push-pull amplifier with a modulated supply voltage, with a separate DC supply network for each active device of the push-pull amplifier.

According to the invention there is provided a power amplifier arrangement comprising: first and second active devices for amplifying in-phase and anti-phase parts of an input signal; a first DC supply network connected between the output of the first active device and a modulated supply voltage; a second DC supply network connected between the output of the second active device and the same modulated supply voltage and an output combiner for combining the amplified in-phase and anti-phase parts of the input signal. The power amplifier arrangement may be referred to as a push-pull power amplifier arrangement or a differential power amplifier arrangement.

The first and second DC supply networks may comprise inductors. The first and second DC supply networks may comprise transmission lines.

The power amplifier arrangement may further comprise a phase splitter for receiving the input signal and for generating the in-phase and anti-phase parts of the input signal.

The output combiner may be a lumped element inductor-capacitor balun. The combiner may comprise: third and fourth inductors having first terminals connected to the outputs of the respective active devices; first and second capacitors, one connected between the first terminal of the third inductor and ground, and one connected between the first terminal of the fourth inductor and the second terminal of the third inductor, wherein the combined signal is generated between the second terminal of the third inductor and ground.

Coupling is introduced between the first and second DC supply networks. The first and second DC supply networks may be first and second windings of a transformer, the transformer further forming an output signal combiner, the combined signal being formed across a third winding of the transformer. The first and second DC supply networks may be first and second windings of a transmission line transformer, the power amplifier arrangement further comprising a transmission line balun transformer having a first and second winding, a first terminal of each of the first and second windings of the transmission line balun transformer connected to the outputs of the respective active devices, the transmission line balun transformer further forming the combiner, a combined signal being formed across second terminals of the first and second winding of the transmission line balun transformer.

The first and second active devices may comprise an output amplifier of a cascaded amplifier stage, the arrangement further comprising: third and fourth active devices for amplifying in-phase and anti-phase parts of a pre-drive signal; third and fourth inductive elements connected in series between the outputs and of the third and fourth active devices, the voltage modulator being connected to provide the modulated supply voltage at the common connection point of the third and fourth inductive elements, and the outputs of the third and fourth active devices providing the input signals for the first and second active devices, the third and fourth active devices forming a driver amplifier.

The input signal may be a radio frequency, RF, signal, the arrangement further comprising an RF supply decoupling capacitor, wherein the value of the RF decoupling capacitor required is lower than that required in an equivalent single ended power amplifier design.

The maximum stable bandwidth of the supply modulator may be increased compared with the bandwidth of an equivalent single ended power amplifier design.

The power amplifier arrangement of any preceding claim wherein the output impedance of the envelope tracking supply voltage is reduced compared with the bandwidth of an equivalent single ended power amplifier design.

The power amplifier arrangement of any preceding claim in which there is overlap of the frequencies in the supply path and the input path to the amplifier.

The power amplifier arrangement of any preceding claim wherein the frequency of the lowest frequency series resonance of the load impedance presented to the supply modulator is increased compared with the equivalent resonance of an equivalent single ended power amplifier design.

The power amplifier arrangement of any preceding claim wherein the magnitude of the supply impedance presented to the power amplifier is decreased compared with the magnitude of the supply impedance of an equivalent single ended power amplifier design.

The power amplifier of any preceding claim in which the modulated supply voltage is an envelope tracked voltage supply.

A mobile cellular communications system handset may include the power amplifier arrangement. A mobile cellular communications system infrastructure element may include the power amplifier arrangement. A wireless local area network including a power amplifier arrangement according to any preceding claim. A radio broadcast transmitter may include the power amplifier arrangement. A television broadcast transmitter may include the power amplifier arrangement. A military communications transmitter may include the power amplifier arrangement.

The invention also provides a power amplifier arrangement comprising: an envelope tracking power supply for generating a modulated supply voltage; first and second active devices for amplifying in-phase and anti-phase parts of an input signal; a first DC supply network connected between the output of the first active device and a modulated supply voltage; a second DC supply network connected between the output of the second active device and the same modulated supply voltage and an output combiner for combining the amplified in-phase and anti-phase parts of the input signal.

The invention provides a power amplification method for a power amplifier arrangement comprising amplifying an in-phase part and an anti-phase part of an input signal; providing a modulated supply voltage to a first active device of the power amplifier via a first DC supply network; providing the same modulated supply voltage to a second active device of the power amplifier via a second DC supply network; and combining the amplified first and second parts of the input signal.

BRIEF DESCRIPTION OF THE FIGURES

The invention is now described by way of example with reference to the accompanying figures in which.

DESCRIPTION OF THE PREFERRED EMBODIMENTS

The invention is described in the following with regard to embodiments illustrating an envelope tracking RF power amplifier, and in particular in arrangements where the RF input signal to be amplified is a video signal. The invention is not, however, limited to the amplification of video signals.

Figure 1:
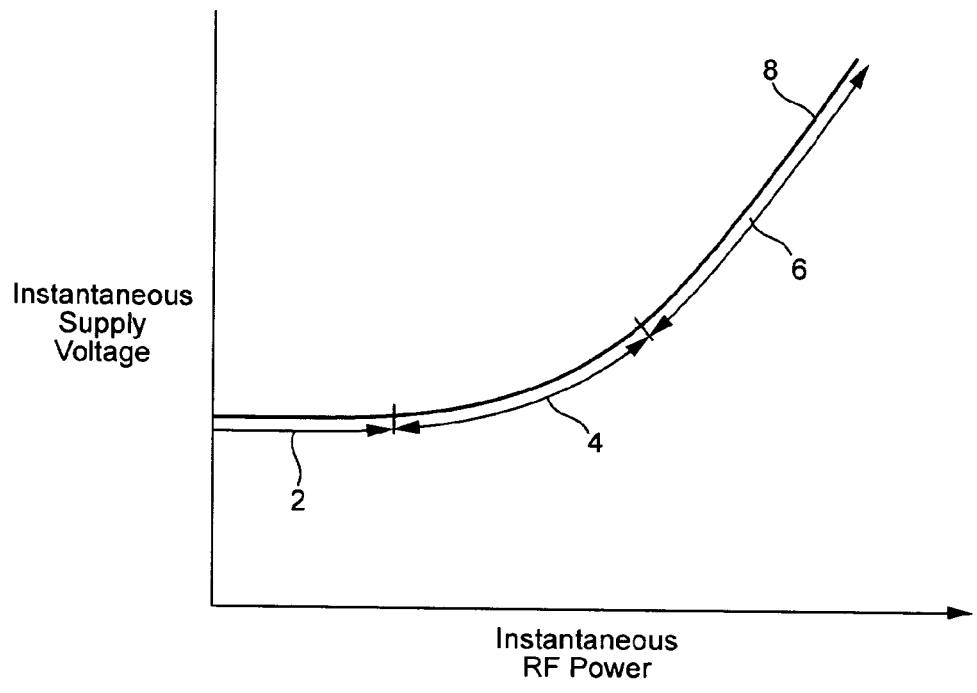
FIG. 1 illustrates the operating regions on an exemplary RF power amplifier.
Figure 2:
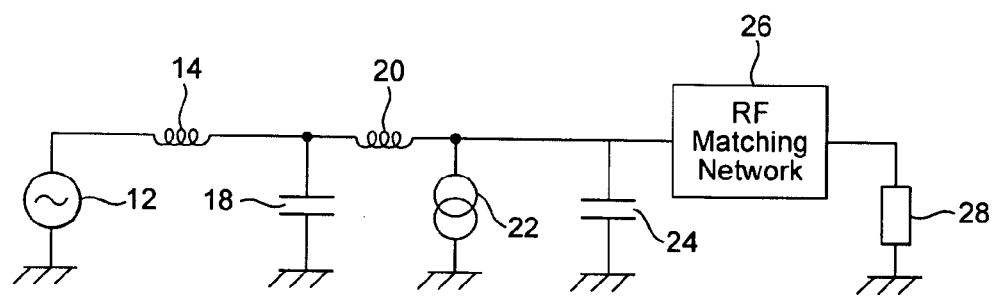
FIG. 2 illustrates a model of an exemplary envelope tracking power supply and power amplifier.

An exemplary model of a supply feed network of an envelope tracking power supply is illustrated in FIG. 2. The arrangement of FIG. 2 is a simplified example of a supply feed network, used for describing the principles of embodiments of the invention. One skilled in the art will appreciate that additional parasitic elements may exist in real DC feed networks, and the invention applies to any such supply feed network.

An ideal voltage modulator 12 is connected between electrical ground and a first terminal of an inductor 14. A second terminal of inductor 14 is connected to a first terminal of an inductor 20. A capacitor 18 has a first terminal connected to electrical ground and a second terminal connected to the second terminal of the inductor 14 and the first terminal of the inductor 20. An ideal RF transistor is represented by a current source 22, and has a first terminal connected to electrical ground and a second terminal connected to the second terminal of the inductor 20. A capacitor 24 has a first terminal connected to electrical ground and a second terminal connected to the second terminal of the inductor 20 and the second terminal of the current source 22. An RF matching network 26 has a first terminal connected to the second terminal of the inductor 20, the second terminal of the current source 22 and the second terminal of the capacitor 24. A second terminal of the RF matching network 26 is connected to a second terminal of a load resistor 28, which has a first terminal connected to electrical ground.

The inductor 14 represents the inductance of the interconnection between the ideal voltage modulator 12 and the power amplifier as represented by current source 22. The capacitor 18 provides RF decoupling. RF current is drawn from the RF decoupling capacitor 18, and video frequency current is drawn from the ideal voltage modulator 12. Typically the supply feed network for an RF power amplifier comprises an inductor such as the inductor 20 shown in FIG. 2, or a transmission line typically having an electrical length of up to ¼ wavelength at the RF carrier frequency, across which the RF power amplifier voltage is generated. The capacitor 24 represents the device capacitance of the ideal RF transistor represented by current source 22.

The ideal voltage modulator 12 provides a low impedance path to video currents and takes the place of large value decoupling capacitors which are used for the same purpose in fixed supply RF power amplifiers.

Figure 3:
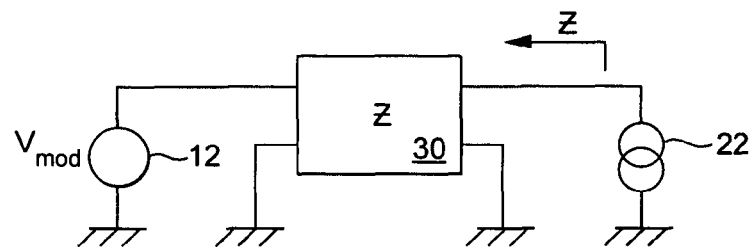
FIG. 3 illustrates an exemplary impedance matrix.

In general, the impedance at the collector or drain of a power amplifier transistor—i.e. the impedance seen from the collector/drain—is determined by the parallel combination of the supply feed components (which may be more complex than the simplified network shown in FIG. 2), the device capacitance and the RF matching network all as shown in FIG. 2. This impedance may be represented by an impedance matrix as illustrated in FIG. 3. Impedance matrix 30 represents the impedance seen at the collector or drain of the power amplifier transistor. The ideal voltage modulator 12 is connected to a first port of the impedance matrix 30, and the ideal RF transistor 22 is connected to a second port of the impedance matrix 30

For an envelope tracking power amplifier it is important to achieve low supply impedance at video frequencies, as the final power amplifier stage operates in compression over a large proportion of the modulation cycle (unlike fixed supply power amplifiers), and hence the conversion loss from supply noise to RF sidebands is lower.

The invention includes a differential or push-pull RF amplifier arrangement. The terms differential amplifier and push-pull amplifier are considered to be interchangeable terms, and define an amplifier arrangement in which two active devices (i.e. transistors) are provided for amplifying an input signal: one active device receives an in-phase part of the input signal for amplification, and the other active device receives an anti-phase part of the input signal for amplification.

In accordance with the invention the differential or push-pull amplifier receives a modulated supply voltage, and in a preferred embodiment receives an envelope tracked supply voltage.

The invention provides a DC (direct current) supply feed network for each active device of the differential or push-pull amplifier. Thus first and second DC supply networks are supplied for the first and second active devices of the differential or push-pull amplifier.

In a described embodiments, the modulated supply is fed to the centre point of two supply feed inductors (comprising the two DC supply networks) or the centre tap of a transformer (equivalent to two coupled inductors or two coupled transmission lines, and providing the DC supply network) in which the active devices of the power amplifier are biased in Class B or Class AB mode. The outputs of the two active devices are combined using a 0°/180° combiner, which may be implemented in many different ways. This supply feed arrangement provides a desired high impedance to the differential RF carrier, whilst also providing low common mode impedance to video supply currents, by virtue of the described supply feed networks.

Figure 4:
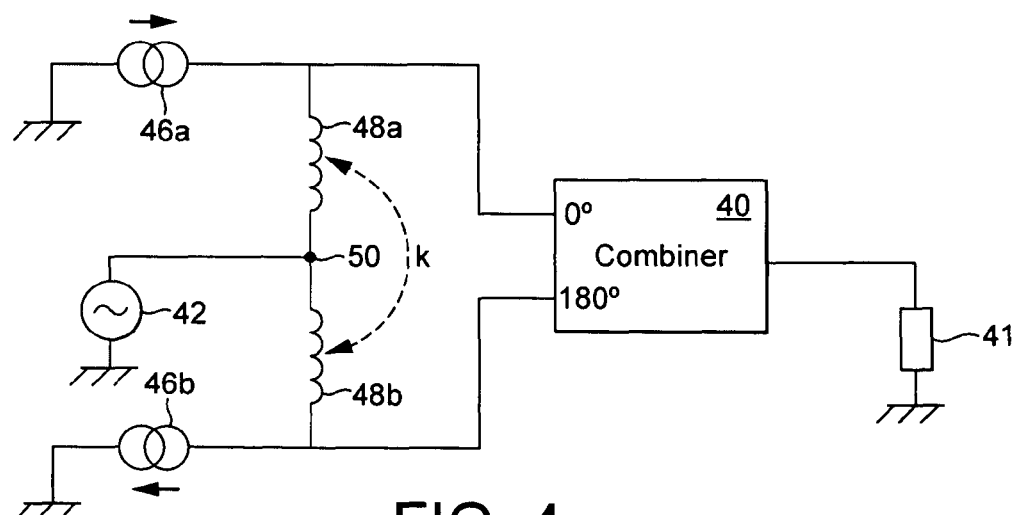
FIG. 4 illustrates an improved amplifier architecture for an envelope tracking RF amplifier in accordance with the invention.

An exemplary arrangement in accordance with the invention is illustrated in FIG. 4, and includes a first current source 46a representing a first active device (transistor) of a differential or push-pull power amplifier; a second current source 46b representing a second active device (transistor) of the differential or push-pull power amplifier; an ideal modulator 42, a first inductor 48a comprising a first DC supply network; a second inductor 48b comprising a second DC supply network; a combiner 40; and load resistor 44.

As illustrated in FIG. 4, the second terminal of the first current source 46a representing the first active device is connected to a non-phase-shifting (in-phase) input (0°) of the combiner 40. The first current source 46a represents a first of two differential inputs to the combiner 40. The second terminal of the second current source 46b representing the second active device is connected to a phase shifting (anti-phase) input (180°) of the combiner 40. The second current source 46b represents a second of two differential inputs to the combiner 40. A first inductor 48a is connected between the second terminal of the first current source 46a and a centre point 50. A second inductor 48b is connected between the second terminal of the second current source 46b and a centre point 50. The modulated voltage supply is connected between the mid-point 50 and electrical ground. A load resistor 44 is connected between the output of the combiner 40 and electrical ground.

The centre point 50, which is the feed point for the ideal voltage modulator 42, is located at a virtual earth due to the network symmetry. This provides some isolation of the modulator supply 42 from large amplitude RF currents. As a result, the amount of RF decoupling required at the feed point 50 can be reduced and the capacitance of the capacitor 18 of FIG. 2 can be reduced. This in turn increases the frequency at which the inductor 14 of FIG. 2 representing the inductance of the supply feed resonates with the RF decoupling capacitance 18, and hence decreases the supply source impedance seen by the power amplifier transistor at high video frequencies.

This can be understood further with respect to FIGS. 5(a) and 5(b).

FIG. 5(a) illustrates the load impedance presented to the supply modulator denoted $Z_{mod\_load}$. As can be seen in FIG. 5(a), this impedance is that seen looking into the first terminal of the inductor 14 from the supply modulator. A plot of this impedance against frequency is illustrated in FIG. 5(b). The plot illustrates how the impedance varies with frequency for different values of capacitor 18.

As illustrated a solid waveform 25 shows the variation of impedance presented to the modulator with frequency for a first value of capacitor 18, and a dashed line waveform 27 shows the variation of the modulated load impedance with frequency for a reduced value of capacitor 18. Each plot shows two minima associated with resonances of the respective LC circuits 14,18 and 20,24. As illustrated, the frequency at which the first resonance occurs increases from $f_2$ to $f_3$ as the value of capacitor 18 is reduced. The frequency of the first series resonance of impedance presented to the modulator by the supply feed network is thus increased.

Figure 6:
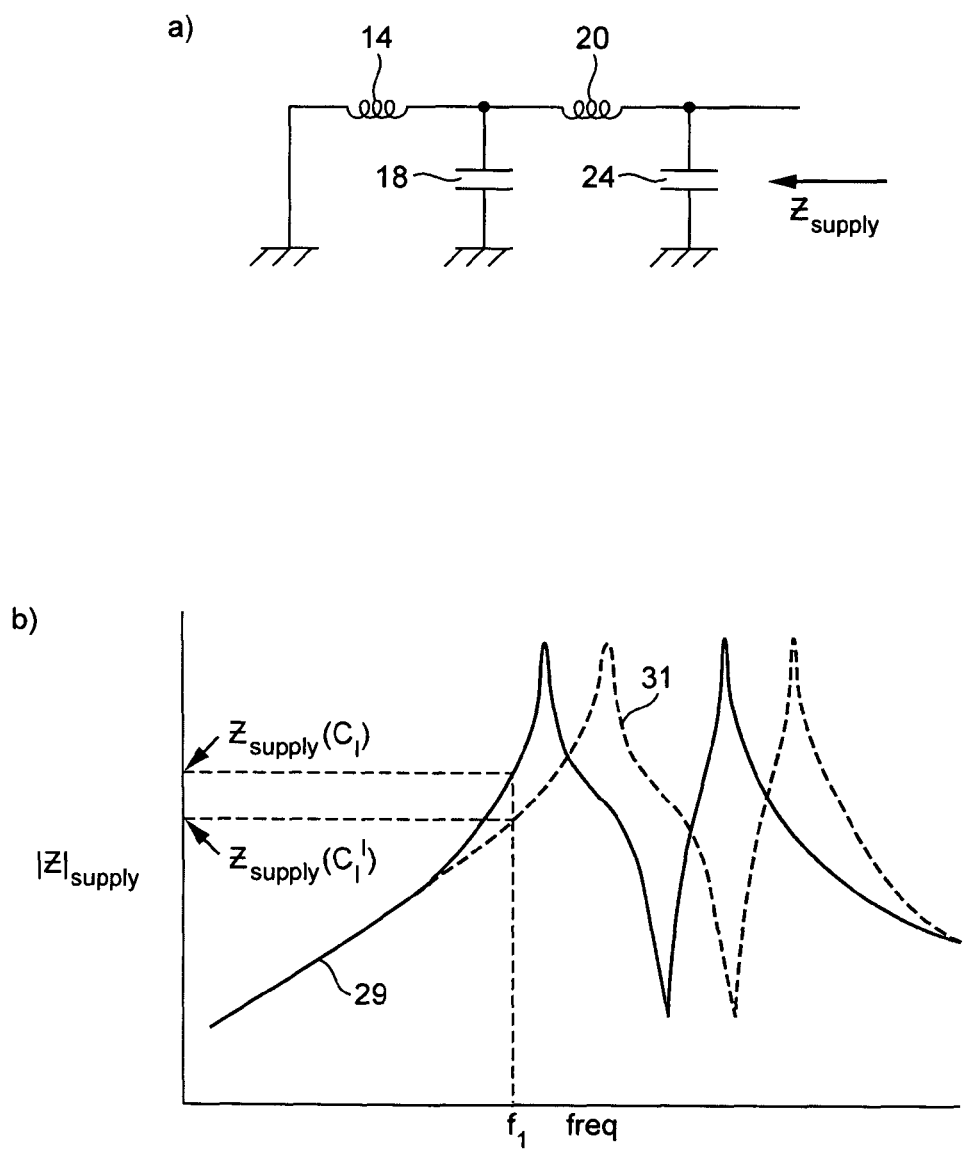
FIG. 6(a) illustrates the exemplary supply impedance and FIG. 6(b) illustrates a plot of the supply impedance against frequency.

FIG. 6(a) illustrates the supply source impedance seen at the intrinsic collector or drain of the power amplifier device denoted $Z_{supply}$. As can be seen in FIG. 6 (a), the supply impedance is the impedance looking into the second terminal of the inductor 20 from the collector/drain of the RF power transistor.

A plot of this supply impedance against frequency is illustrated in FIG. 6(b). The plot illustrates how the impedance varies with frequency for different values of capacitor 18. As illustrated a solid waveform 29 shows the variation of the supply impedance with frequency for a first value of capacitor 18, and a dashed line waveform 31 shows the variation of the supply impedance with frequency for a reduced value of capacitor 18. As illustrated, for a given frequency $f_1$ the supply impedance is reduced as the value of the capacitor 18 is reduced, resulting in reduced error between ideal and actual supply voltage at the PA device.

It should be noted that in the simplified supply feed shown in FIG. 5(a) the idealised RF transistor is assumed to have infinite output impedance and is replaced by an open circuit. Additionally, it should be noted that in FIG. 6(a), the idealised modulated supply is assumed to have zero output impedance and is replaced by a short circuit.

Figure 5:
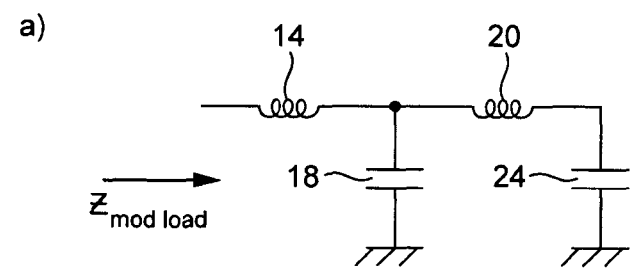
FIG. 5(a) illustrates the exemplary load impedance and FIG. 5(b) illustrates a plot of the load impedance against frequency.
Figure 5:
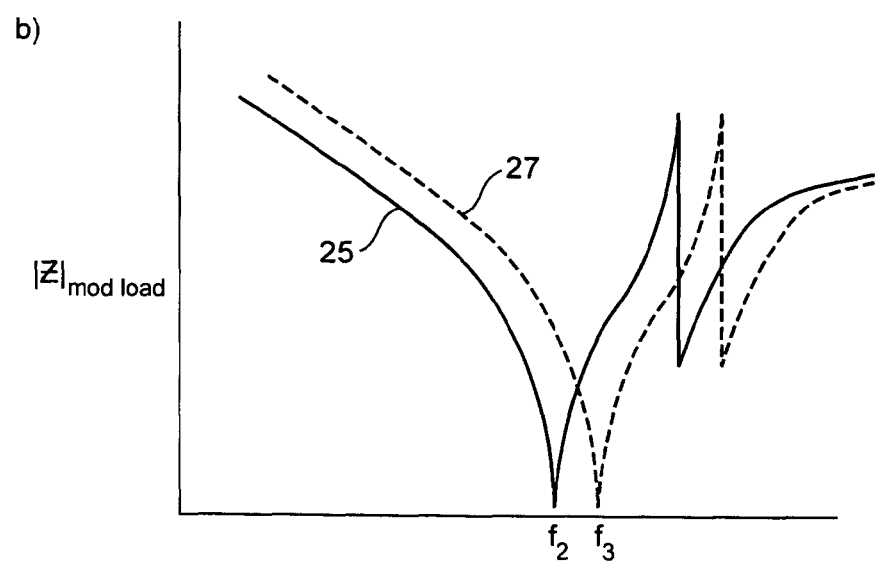

By utilising the inventive arrangement exemplified by FIG. 4, the value of the decoupling capacitor 18 can be reduced, to allow the improved impedance characteristics as described with reference to FIGS. 5 and 6.

As a result of the arrangement of FIG. 4, which permits a reduction in the value RF decoupling capacitance and consequently exhibits an increase in the frequency of the first supply resonance, it is possible to substantially increase the bandwidth of the modulated supply. This in turn reduces the output impedance of the supply modulator, and so eases the task of stabilising the power amplifier. This arrangement also reduces the mis-tracking of the supply voltage at the power amplifier device which in turn reduces transmitter distortion.

The RF amplifier to supply modulator isolation provided by inductors 48a and 48b in FIG. 4 allows overlap between video frequencies processed in the supply path (the envelope path) and RF frequencies processed in the path to the input of the amplifier (the RF path). This allows construction of broadband, high efficiency envelope tracking RF power amplifiers operating with wide bandwidth RF modulation at low carrier frequencies.

Referring to FIG. 4, coupling between the two exemplary supply feed inductors 48a and 48b (or alternatively the transformer), which both have self-inductance L, may be introduced to increase the difference between the even mode and odd mode impedances.

Figure 7:
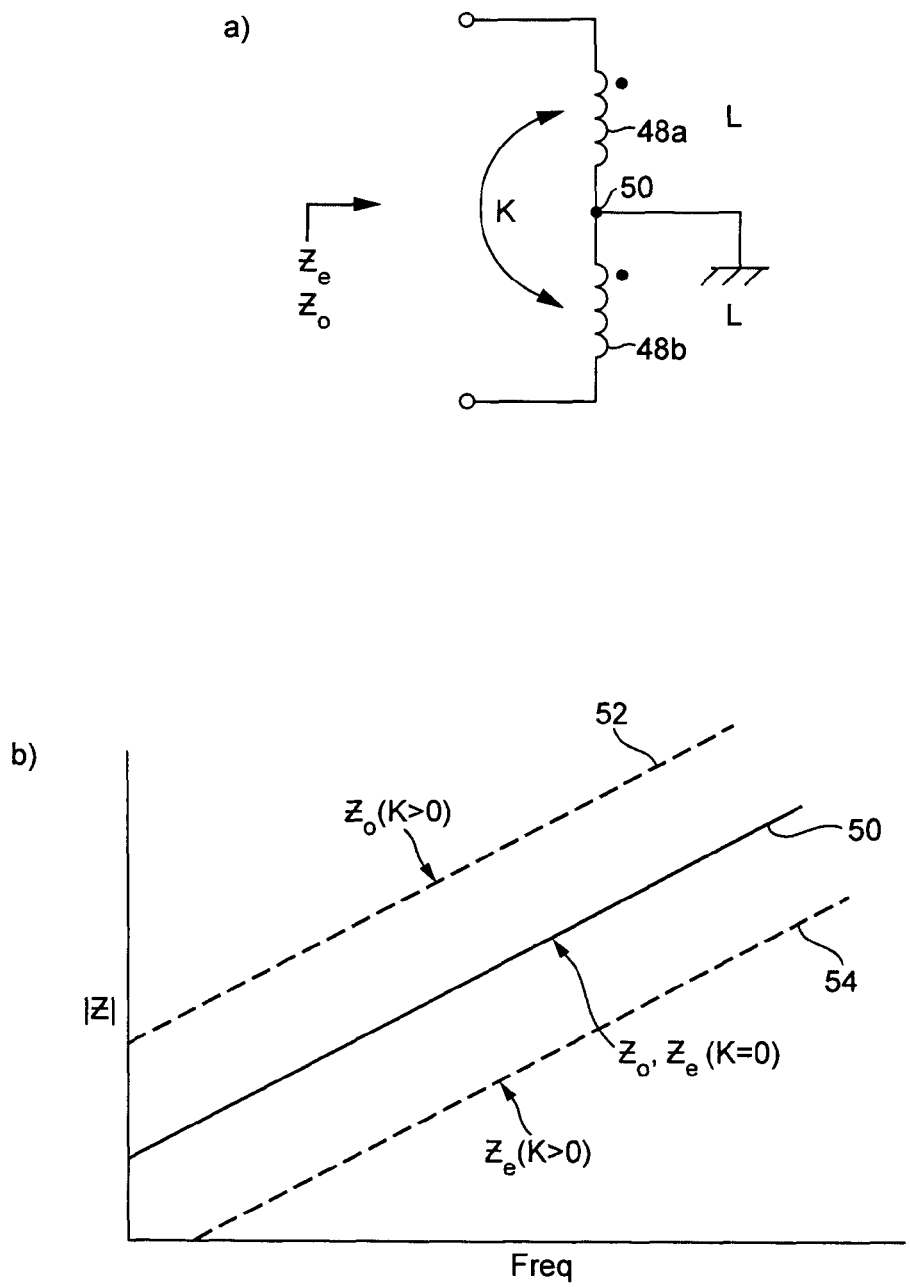
FIG. 7(a) illustrates the exemplary inductors of the arrangement of FIG. 4.
FIG. 7(b) illustrates associated impedance performance.

Referring to FIG. 7(a), coupling between the inductors 48a and 48b is denoted by a value k. The centre point 50 between the two inductors 48a and 48b represents the connection to the ideal supply modulator 42. In FIG. 7(a) the zero output impedance of the ideal modulator is represented by a short circuit.

The even mode impedance seen at the collector or drain of the power amplifier transistors is:

$$Z_e = s(L+M)$$

The odd mode impedance is:

$$Z_o = s(L-M)$$

where L is the self-inductance of the inductors 48a and 48b, and M is the mutual inductance of the supply feed inductors 48a and 48b.

FIG. 7(b) is a plot of the magnitude of the even and odd mode impedances against frequency, showing the effect of varying the coupling between the inductors.

It can be seen from the above equations, and it is also illustrated in FIG. 7(b), that when the coupling coefficient k is equal to zero (i.e. there is no coupling between the inductors) and hence M is equal to zero, the odd and even mode impedances are the same. This is illustrated by plot 50 on FIG. 7(b).

When the coupling coefficient k is greater than zero and hence M is less than zero, the odd mode impedance is increased as illustrated by plot 52, and the even mode impedance is decreased as denoted by plot 54.

With an ideal transformer, the coupling coefficient is equal to one. In this case the odd mode impedance is doubled and the even mode impedance is zero.

In practice, parasitic elements limit the minimum attainable even mode impedance and the transformer should be designed to minimise even mode impedance in the frequency range of most interest.

As mentioned above, there are a number of alternative implementations for the ideal envelope tracking power amplifier architecture shown in FIG. 4, some examples of which are described in the following with reference to FIGS. 8 to 11.

Figure 8:
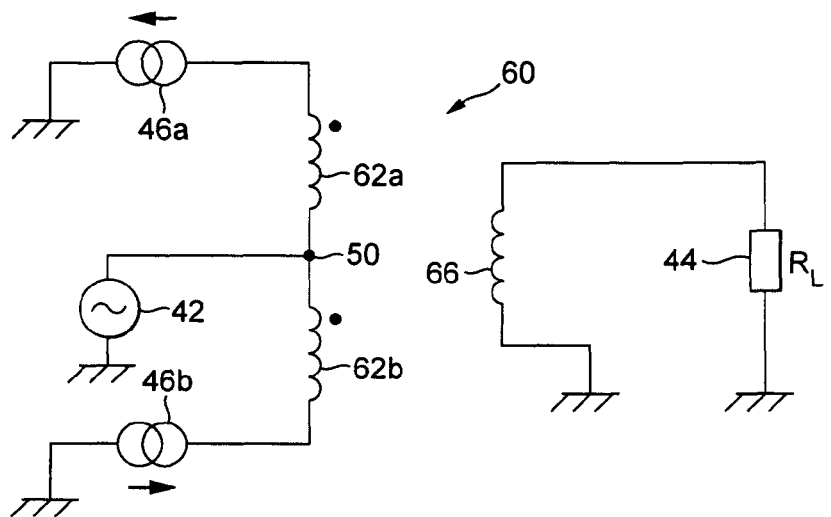
FIG. 8 illustrates a first alternative implementation of the invention.

One alternative implementation is shown in FIG. 8. In the arrangement of FIG. 8, the arrangement of FIG. 4 is modified to use a DC isolated winding on the transformer to implement the 0°/180° combining function in place of the combiner 40 of FIG. 4. Windings of the combiner take the place of the inductors of FIG. 4.

Thus as illustrated in FIG. 8 a transformer 60 is provided having two primary windings 62a and 62b, and a secondary winding 66. The primary windings 62a and 62b have the same purpose and connection as the inductors 48a and 48b of FIG. 4, to provide the first and second DC supply networks. The secondary winding has one terminal connected to the load 44, and one terminal connected to electrical ground. The transformer 60 combines the two components of the amplifier output signal to provide the combined output signal for the load 44.

The architecture of FIG. 8 is particularly but not exclusively suited to implementation of broadband RF power amplifiers using ferrite cored transformers, including those in which the frequency range of the video supply currents and the RF currents overlap. It is also particularly but not exclusively suited for the design of low-power power amplifiers using on-chip transformers. The RF frequency range supported by this architecture is determined by the design of the transformer.

Figure 9:
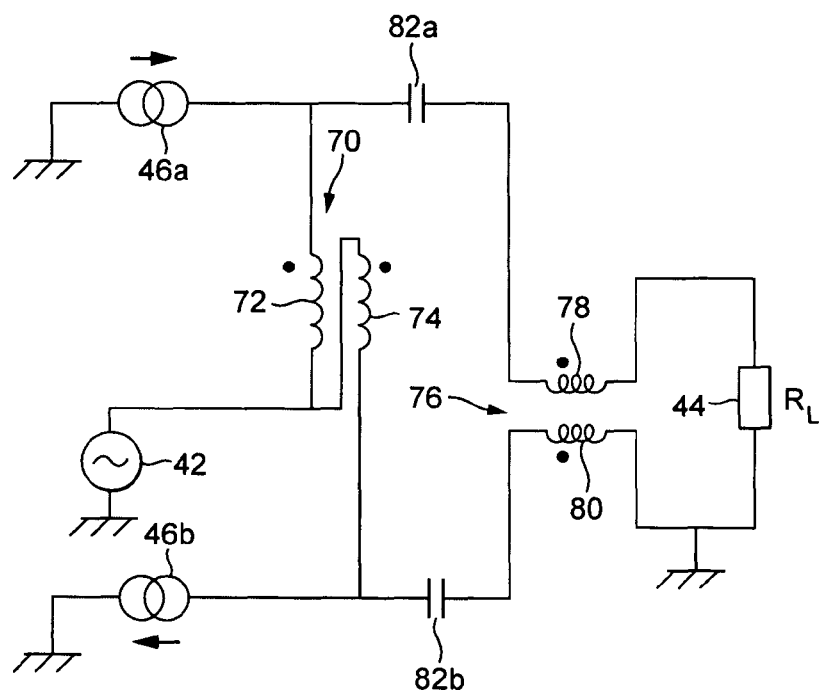
FIG. 9 illustrates a second alternative implementation of the invention.

Another alternative implementation is shown in FIG. 9. The arrangement of FIG. 9 uses a transmission line transformer 70 and a transmission line balun transformer 76 with no DC isolation in place of the single three winding conventional transformer of FIG. 8.

As can be seen one terminal of each of the primary and secondary windings 72 and 74 of the transformer 70 are respectively connected to the second terminals of the current sources 46a and 46b; and the other terminals of the primary and secondary windings 72 and 74 are connected to receive the modulated supply from the modulator 42. The second terminals of the current sources 46a and 46b are connected to a first terminal of respective capacitors 82a and 82b, and the second terminals of respective capacitors 82a and 82b are connected to terminals of respective primary and secondary windings 78 and 80 of transformer 76. The load 44 is connected across the other terminals of the primary and secondary windings 78 and 80.

The use of transmission line transformers in FIG. 9 reduces the transformer parasitic leakage inductance in comparison to the arrangement of FIG. 8, and hence permits the construction of power amplifiers with an even wider fractional RF bandwidth.

Figure 10:
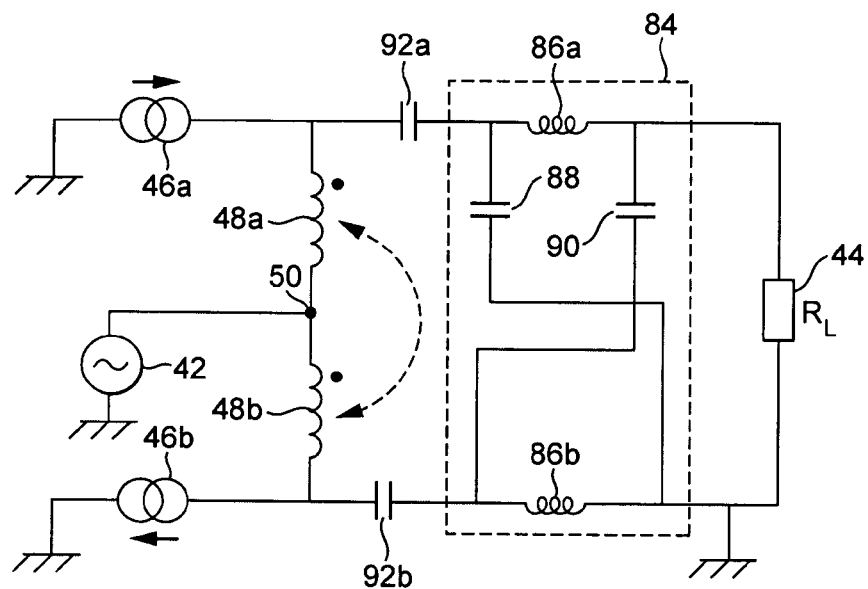
FIG. 10 illustrates a third alternative implementation of the invention.

A further alternative implementation is shown in FIG. 10. The arrangement of FIG. 10 differs to that of FIG. 4 inasmuch as the combiner 40 is replaced by a lumped element lattice balun 84.

The second terminals of the current sources 46a and 46b are connected to a first terminal of respective capacitors 92a and 92b, and the second terminals of respective capacitors 92a and 92b are connected to first terminals of respective inductors 86a and 86b. Second terminals of respective inductors 86a and 86b are connected to the respective terminals of the load 44. A capacitor 88 is connected between the first terminal of inductor 86a and the second terminal of inductor 86b; and a capacitor 90 is connected between the first terminal of inductor 86b and the second terminal of inductor 86a.

The architecture of FIG. 10 is particularly but not exclusively suitable for on-chip implementation and uses two inductors or transmission lines which may or may not be coupled for the supply feed, and a lattice balun implemented with discrete L/C components to implement the 0°/180° combiner.

The push-pull envelope tracking power amplifier architecture offers further benefits for amplifier designs in which both the final and driver stages are modulated. In these designs the supply paths to the driver and final stage form a feedback path from the output to the input of the final stage. For stable operation the attenuation via this path must be less than the forward gain of the output stage. The use of a push-pull envelope tracking architecture for the final stage and/or the driver stage increases the supply isolation and hence also increases the attenuation via the supply feedback path, as illustrated in FIG. 11.

Figure 11:
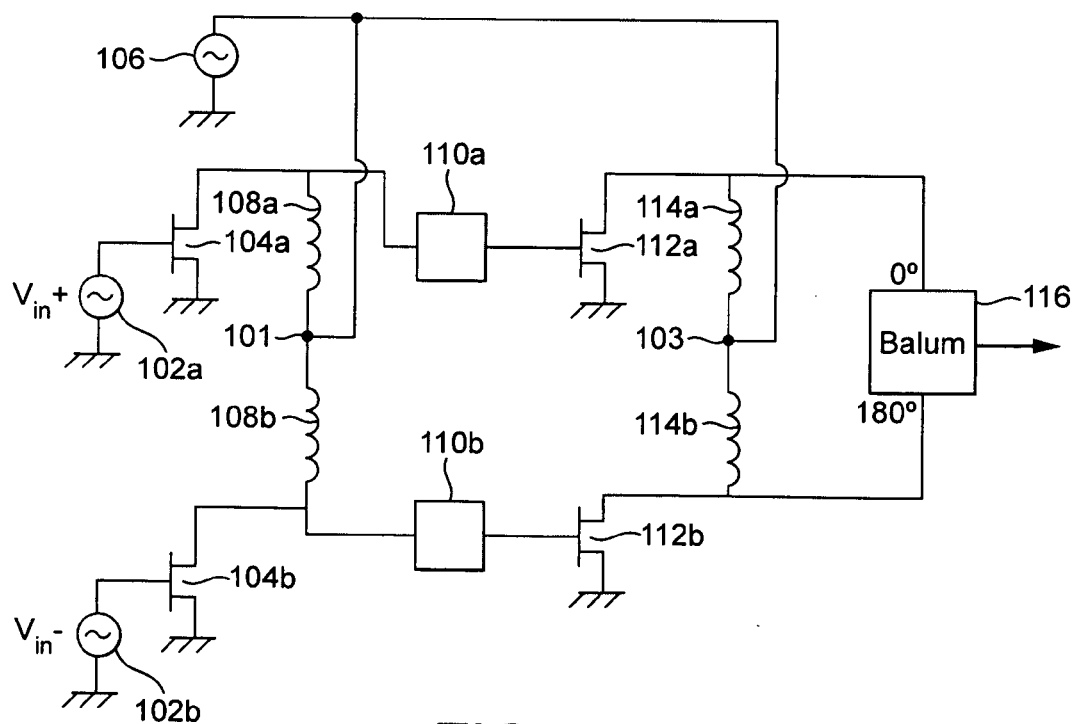
FIG. 11 illustrates a fourth alternative implementation of the invention.

With reference to FIG. 11, the architecture includes first and second voltage sources 102a and 102b configured to provide differential drive signals to first and second power transistors 104a and 104b forming a first power amplifier; first and second inductors 108a and 108b; a modulated supply 106; first and second inter-stage matching networks 110a and 110b; third and fourth transistors 114a and 112a and 112b forming a second power amplifier; third and fourth inductors 114a and 114b; and a balun 116. The first and second power transistors 104a and 104b form a push-pull driver stage, and the third and fourth power transistors 112a and 112b form a push-pull output stage.

As illustrated in FIG. 11, one of the drain collector of the first transistor 104a is connected to an input of filter 110a. The other one of the drain/collector of the first transistor 104a is connected to electrical ground. The gate/base of the transistor 104a is connected to receive a voltage from the first voltage source 102a. One of the drain/collector of the second transistor 104b is connected to an input of filter 110b. The other one of the drain/collector of the first transistor 104b is connected to electrical ground. The gate/base of the transistor 104b is connected to receive a voltage from the first voltage source 102b. The first inductor 108a is connected between one of the drain/collector of the first transistor 104a and a centre point 101. A second inductor 108b is connected between the one of the drain/collector of the second transistor 104b and the centre point 101. The modulated voltage supply 106 is connected to the centre point 101.

One of the drain/collector of the third transistor 112a is connected to an input of the balun 116. The other one of the drain/collector of the third transistor 112a is connected to electrical ground. The gate/base of the transistor 112a is connected to receive a signal from the output of the filter 110a. One of the drain/collector of the fourth transistor 112b is connected to a second input of the balun 116. The other one of the drain/collector of the fourth transistor 112b is connected to electrical ground. The gate/base of the transistor 112b is connected to receive a signal from the filter 110b. The third inductor 114a is connected between one of the drain/collector of the third transistor 112a and a centre point 103. A second inductor 114b is connected between the one of the drain/collector of the fourth transistor 112b and the centre point 103. The modulated voltage supply 106 is connected to the mid-point centre point 103.

The balun 116 generates an output which is connected to a load. It can be seen that the arrangement of FIG. 11 represents a two-stage cascaded output utilising the principles of the arrangement of FIG. 4.

The invention is described herein with reference to an example of an application to an envelope tracking RF power amplifier. The invention may be advantageously implemented in any apparatus utilising such an arrangement. Envelope tracking power amplifiers are well-known in the art. The instantaneous envelope of the input signal to be amplified is used to generate an appropriate voltage supply level for that instant. A know envelope tracking power supplies selects one of a plurality of available supply voltages dependent upon the input signal level, and then adjusts or corrects the selected supply voltage before delivering it to the power amplifier.

Exemplary applications of the invention include, but are not limited to: cellular handsets; wireless local area networks; wireless infrastructure; radio and television broadcast transmitters; and military power amplifier applications, from high frequency (HF) to microwave frequency ranges of operation.

The invention is described herein with reference to particular examples and embodiments. One skilled in the art will appreciate that the invention is not limited to the details with which these examples and embodiments are described, the scope of the invention being defined by the appended claims.

What is claimed is:

1. A power amplifier arrangement comprising:
    first and second active devices for amplifying in-phase and anti-phase parts of an input signal;
    a first DC supply network connected between an output of the first active device and an output of a modulator;
    a second DC supply network connected between an output of the second active device and the same output of the modulator; and
    an output combiner for combining the amplified in-phase and anti-phase parts of the input signal, wherein the output combiner comprises a lumped element inductor-capacitor balun.

2. The power amplifier arrangement of claim 1 wherein the first and second DC supply networks are inductors.

3. The power amplifier arrangement of claim 1 wherein the first and second DC supply networks are transmission lines.

4. The power amplifier arrangement of claim 1 further comprising a phase splitter for receiving the input signal and for generating the in-phase and anti-phase parts of the input signal.

5. The power amplifier arrangement of claim 1 wherein the output combiner comprises:
    third and fourth inductors having first terminals connected to the outputs of the respective active devices;
    a first capacitor connected between the first terminal of the third inductor and ground; and
    a second capacitor connected between the first terminal of the fourth inductor and a second terminal of the third inductor,
    wherein the combined signal is generated between a second terminal of the third inductor and ground.

6. The power amplifier arrangement of claim 1 in which coupling is introduced between the first and second DC supply networks.

7. A power amplifier arrangement comprising:
    first and second active devices for amplifying in-phase and anti-phase parts of an input signal;
    a first DC supply network connected between an output of the first active device and an output of a modulator;

a second DC supply network connected between an output of the second active device and the same output of the modulator; and an output combiner for combining the amplified in-phase and anti-phase parts of the input signal, wherein the first and second DC supply networks are first and second windings of a transformer, the transformer further forming the output combiner, the combined signal being formed across a third winding of the transformer.

8. The power amplifier arrangement of claim 7 wherein the first and second DC supply networks are first and second windings of a transmission line transformer, the power amplifier arrangement further comprising a transmission line balun transformer having first and second windings, a first terminal of each of the first and second windings of the transmission line balun transformer coupled to the outputs of the respective active devices, the transmission line balun transformer further forming the combiner, the combined signal being formed across second terminals of the first and second windings of the transmission line balun transformer.

9. A power amplifier arrangement comprising:
first and second active devices, forming a driver amplifier, for amplifying in-phase and anti-phase parts of a pre-drive signal to generate in-phase and anti-phase parts of an input signal;

first and second inductive elements connected in series between outputs of the first and second active devices a modulator for providing a modulated supply voltage at a common connection point of the first and second inductive elements;

third and fourth active devices comprising an output amplifier of a cascaded amplifier stage, configured to amplify the in-phase and anti-phase parts of the input signal;

a first DC supply network connected between an output of the third active device and an output of the modulator;

a second DC supply network connected between an output of the fourth active device and the same output of the modulator; and an output combiner for combining the amplified in-phase and anti-phase parts of the input signal.

10. The power amplifier arrangement of claim 1 wherein the input signal is a radio frequency, RF, signal, the arrangement further comprising an RF supply decoupling capacitor, wherein the value of the RF decoupling capacitor required is lower than that required in an equivalent single ended power amplifier design.

11. The power amplifier arrangement of claim 1 wherein the maximum stable bandwidth of the modulator is increased compared with the bandwidth of an equivalent single ended power amplifier design.

12. The power amplifier arrangement of claim 1 wherein the output impedance of the modulator is reduced compared with the bandwidth of an equivalent single ended power amplifier design.

13. The power amplifier arrangement of claim 1 in which there is overlap of the frequencies in a signal at the output of the modulator and the input signal.

14. The power amplifier arrangement of claim 1 wherein the frequency of the lowest frequency series resonance of the load impedance presented to the modulator is increased compared with the equivalent resonance of an equivalent single ended power amplifier design.

15. The power amplifier arrangement of claim 1 wherein the magnitude of the supply impedance presented to the power amplifier is decreased compared with the magnitude of the supply impedance of an equivalent single ended power amplifier design.

16. The power amplifier arrangement of claim 1 wherein the modulator comprises an envelope tracked voltage supply.

17. A mobile cellular communications system handset including a power amplifier arrangement according to claim 1.

18. A power amplification method for a power amplifier arrangement comprising:
amplifying an in-phase part and an anti-phase part of an input signal;
providing a modulated supply voltage to a first active device of the power amplifier arrangement via a first DC supply network;
providing the same modulated supply voltage to a second active device of the power amplifier arrangement via a second DC supply network; and
combining, via a lumped element inductor-capacitor balun, the amplified in-phase and anti-phase parts of the input signal.

* * * * *